(12) United States Patent
Guillot (10) Patent No.: US 6,387,730 B2
(45) Date of Patent: May 14, 2002

(54) HYBRID S.C. DEVICES AND METHOD OF MANUFACTURE THEREOF

(75) Inventor: Marie Guillot, Cloyne (IE)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/820,534

(22) Filed: Mar. 29, 2001

Related U.S. Application Data (62) Division of application No. 09/430,875, filed on Nov. 1, 1999.

(51) Int. Cl.[7] .......................... H01L 21/44; H01L 21/48; H01L 21/50
(52) U.S. Cl. ........................ 438/107; 438/106; 438/123; 257/678; 257/690
(58) Field of Search ................................. 438/118, 119, 438/123, 109, 107, 106; 257/686, 690, 678

(56) References Cited

U.S. PATENT DOCUMENTS 5,484,097 A * 1/1996 Heuvel ..................... 228/123.1

FOREIGN PATENT DOCUMENTS

| EP | 0 058 852 | 9/1982 | ........... H01L/23/48 |
| EP | 0 391 832 | 10/1990 | ........... H01L/23/36 |
| JP | 60007759 | 1/1985 | ........... H01L/25/02 |
| JP | 61294845 | 12/1986 | ........... H01L/25/04 |

* cited by examiner

*Primary Examiner*—Wael Fabaany, Jr.
*Assistant Examiner*—Hsien Ming Lee
(74) *Attorney, Agent, or Firm*—Mayer Fortkort & Williams, PC; Karin L. Williams, Esq.

(57) ABSTRACT

A hybrid semiconductor device comprises four identical semiconductor diode chips each having top and bottom surfaces. Each chip is mounted on a respective mounting pad all of which lie in a common plane and, for ease of assembly, the four chips are mounted in identical top to bottom orientation, e.g., bottom surface down and electrically connected to the mounting pads. In one embodiment, the mounting pads for the chips and terminals for the device are integral with leads of a single ("component") lead frame and various electrical connectors for the chips comprise bonding wires or stamped metal jumpers added to the workpiece after the chips are mounted on the lead frame. The metal jumpers can be provided on a separate "jumper" lead frame used in cooperation with the component lead frame, or the jumpers can comprise portions of leads of the single component lead frame. Printed circuit boards embodiments are also disclosed.

2 Claims, 9 Drawing Sheets

HYBRID S.C. DEVICES AND METHOD OF MANUFACTURE THEREOF

CROSS-REFERENCE TO RELATED APPLICATIONS

This application is a division of co-pending U.S. patent application Ser. No. 09/430,875, filed Nov. 1, 1999 entitled "Hybrid Semiconductor Devices and Method of Manufacture Thereof.

BACKGROUND OF THE INVENTION

This invention relates to hybrid semiconductor devices, and particularly to the automatic fabrication of semiconductor devices containing multiple, interconnected semiconductor chips.

While not limited thereto, the invention has particular utility in the fabrication of two phase (full wave) bridge rectifiers including four interconnected semiconductor rectifier chips and four terminals for connecting the bridge rectifiers into an electrical circuit. Such bridge rectifiers are used in large quantities, and highly automated processes have been developed for their manufacture.

In one process, for example, described in U.S. Pat. No. 5,484,097 to W. Heuvel, the subject matter of which is incorporated herein by reference, two semiconductor chips are mounted on two spaced apart support plates of each of two lead frames, and the two lead frames are disposed one on top of the other to provide two, two-chip stacks of chips. In one stack, the chips are stacked anode to anode, and in the other stack the chips are stacked cathode to cathode. The two lead frames, along with a third lead frame overlying the chip stacks, provide the necessary interconnections among the four chips as well as the device four terminals. The process described results in a single bridge rectifier. In practice, a plurality of devices, one each at a plurality of spaced apart device sites on the three-lead frame workpiece, are simultaneously (batch) fabricated.

The process is quite satisfactory except that a relatively large number (three) of separate lead frames are used; careful parts registrations are required and, in the process of mounting the individual chips on their respective support plates, one pair of chips for each bridge rectifier must be inverted with respect to the other pair thereof. All the chips are identical and, typically, are simultaneously identically fabricated as part of a single semiconductor wafer. In a final chip processing step, the wafer is diced into individual chips which, while completely separated, remain in a planar array of chips lightly adhered to, for example, a sheet of plastic. During mounting of the chips on the lead frames, two chips for each bridge rectifier are lifted from the array of chips and are directly transferred to and placed on a respective support plates of each lead frames. The other two chips for each bridge rectifier, however, must be removed from the array of chips and somehow turned upside down prior to their transfer to and placement on the other two lead frame support plates.

While many, and generally satisfactory techniques exist for the automatic inversion of semiconductor chips, the very fact that an extra process is required for one pair of chips not required for the other inevitably means that there is some loss of efficiency and some loss of product owing to parts breakage. The present invention eliminates the need for inverting one pair of chips relative to the other and, indeed, eliminates the practice of forming pairs of lead stacks. Also, preferably, only one chip mounting substrate is used.

SUMMARY OF THE INVENTION

Four identical semiconductor chips, each having a top and bottom surface are respectively mounted, bottom surface down, on four spaced apart mounting pads included on support plates. Two of the mounting pads are part of a common first support plate, hence the bottom surfaces of the two chips mounted on the first plate are electrically interconnected. The other two mounting pads are included on respective second support plates separate from one another and separate from the first support plate. In a preferred embodiment, all the mounting pads are located in one plane, and so are all the chips. The second support plates are larger than the mounting pads included thereon and each support plate exposes a bonding surface which is electrically connected to the bottom surface of the chip mounted on the bonding pad thereof. A respective first electrical interconnector is provided between each bonding surface of each second support plate and a top surface of a respective chip mounted on the first support plate. Thus, the bottom surfaces of the two chips mounted on the two second support plates are connected to respective top surfaces of the two chips mounted on the first support plate. A second electrical interconnector is provided between the top surfaces of the two chips mounted on the respective second support plates. The four chips are thus properly interconnected together in a bridge rectifier configuration. Four terminals of the device include a first terminal connected to the first support plate, second and third terminals connected to respective second support plates, and a fourth terminal connected to a top surface of one of the chips mounted on one of the second support plates.

According to a first aspect of the invention, the three support plates, including one "first" support plate and two "second" support plates, comprise three conductive areas on a surface of a printed circuit board including three printed conductive paths, serving as device terminals, extending into contact with respective support plates. A fourth printed conductive path, serving as a device fourth terminal, extends adjacent to one of the second support plates where an electrical interconnector electrically connects the fourth terminal to the top surface of the chip mounted on the one support plate. Using known printed circuit board technology, the various electrical interconnectors needed to provide the bridge rectifier configuration can comprise known wire bonds added during device fabrication or buried, pre-formed conductors of multi-layered printed circuit boards. Alternatively, the electrical interconnectors can comprise stamped metal "jumpers" developed in connection with a second aspect of the invention.

According to such second aspect of the invention, the three support plates, including the four mounting pads disposed thereon, are disposed along the lengths of three leads which, along with a fourth lead extending towards one of the mounting pads, are all integral portions of a single lead frame. After bonding of the four chips to respective mounting pads and providing necessary electrical interconnections to form a bridge rectifier, the four chips and portions of the lengths of the four leads are encapsulated in a housing. Portions of the leads extending from the housing are severed from each other and from the lead frame to provide externally extending terminals for the rectifier. The electrical interconnections are formed by known wire bonds or, preferably, by pre-formed metal jumpers themselves provided as parts of a lead frame.

DESCRIPTION OF THE DRAWING

The drawings are schematic and not necessarily to scale.

DESCRIPTION OF PREFERRED EMBODIMENTS OF THE INVENTION

Figure 1:
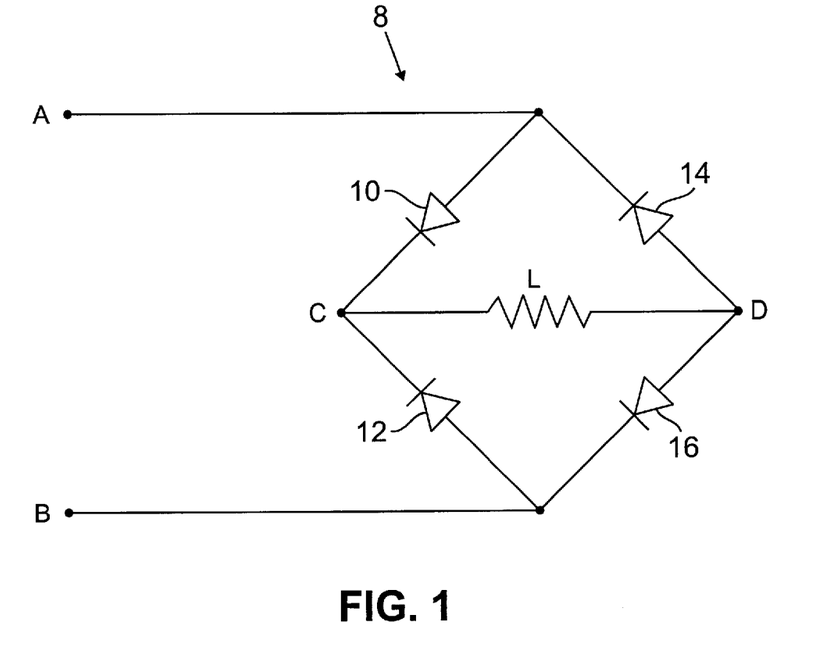
FIG. 1 is a schematic circuit diagram of a known bridge rectifier device.
Figure 2:
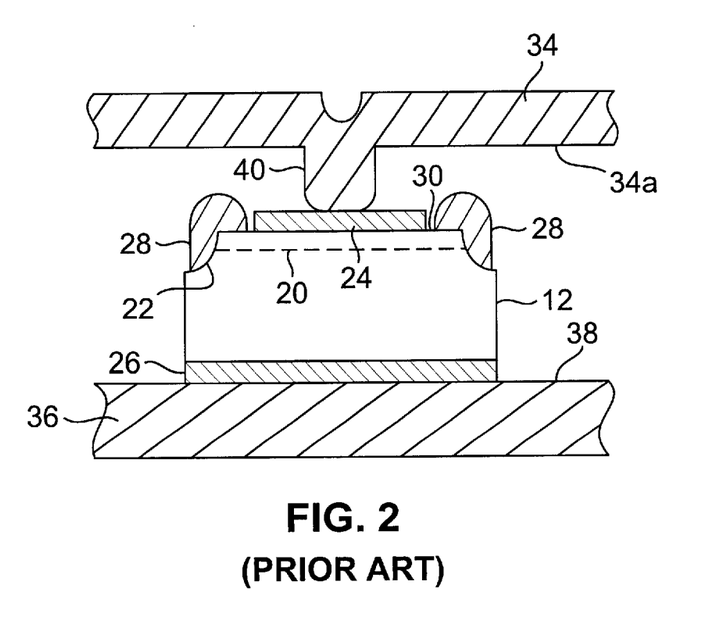
FIG. 2 is a side elevational view of a known semiconductor diode chip soldered between a pair of terminals; one of the terminals including a dependent dimple.

FIG. 1 is a schematic circuit diagram of a known bridge rectifier device 8 comprising four identical semiconductor diode chips 10, 12, 14 and 16. The two chips 10 and 12 are connected cathode to cathode, the two chips 14 and 16 are connected anode to anode, and each interconnection between each pair of chips comprises a respective circuit node A, B, C, and D. In use of the device, as indicated in FIG. 1, a load L (e.g., a resistor) is connected between the device nodes C and D and an a.c. power supply is connected between the nodes A and B. Operation of the device results in current flowing through the load L always in the same direction regardless of the instantaneous polarity of the a.c. voltage applied between the nodes A and B. (The circuit arrangement shown in FIG. 1 herein is well known. While the subject matter of U.S. Pat. No. 5,484,097 is herein incorporated by reference, it is noted that the circuit configuration shown in FIG. 1 of the patent is incorrect; the correct configuration being indicated in FIG. 2 of the patent. FIG. 2 of the patent correctly shows, consistently with other disclosures of the patent, one pair of chips stacked cathode to cathode and the other pair of chips stacked anode to anode.)

Typically, the four semiconductor diode chips used in the bridge rectifier 8 are as identical to one another as is practical with standard manufacturing processes and, in one typical known device, each chip, e.g., the chip 12 shown in FIG. 1, is as shown in FIG. 2. The chip contains a p-n junction 20 lying in a plane extending entirely across the chip and intersecting the chip side surface 22. Metal electrodes 24 and 26 are provided at opposite surfaces of the chip, and a layer 28 of passivating material, typically glass, covers an upper portion of the chip side surface 22 (and the p-n junction side intercept) and extends onto the chip "upper" surface 30 in the form of an annular ring. FIG. 2 also shows terminals 34 and 36 connected to the two chip electrodes 24 and 26, respectively. The terminals comprise leads from lead frames (not shown) similar to the lead frames in the aforecited patent and, typically, the leads are soldered to the chip electrodes.

In FIG. 2, the upper surface portion of the chip 12 is of P type conductivity, hence the electrode 24 is the anode of the diode chip 12 and the electrode 26 is the diode cathode. The chip 12 is shown mounted "cathode side down."

The passivating layer 28 does not extend onto the chip bottom electrode 26 which is thus fully exposed at the bottom of the chip. Accordingly, the bottom terminal 36 can have a continuous flat surface 38. At the chip upper surface 30, however, it is essential that the upper terminal 34 not contact the passivating layer 28 where it overlies the chip upper surface 30. To ensure this, the upper terminal 34 is provided with a dependent circular dimple 40 of sufficiently small diameter to extend inwardly of the central opening of the passivating layer surface annulus for contacting the metal electrode 24 without contacting the passivating layer 28.

The use of the dimpled terminal 34 presents two problems. One is the expense of providing the dimple in an otherwise flat terminal. The other problem is that of properly centering the dimple 40 within the annular layer 28 and maintaining the position of the dimple from the time of initial assembly of the terminal 34 on the chip to the time the terminal is rigidly soldered to the electrode 24. As described hereinafter, a feature of the present invention is the use of an improved and more reliable means for attaching the chip upper terminal.

A further problem of the prior art assembly process shown in the aforecited U.S. patent is, as previously mentioned, the need for inverting two of the chips relative to the other two chips in each bridge rectifier device. (Another problem is the need for stacking one chip on another to form the two-chip stacks.) In one known process, chips are batch inverted by means of a vibrating bowl which uniquely orients the chips based upon a top to bottom asymmetry of the chips. While the chip shown in FIG. 2 is asymmetrical with respect to the presence of the passivating layer 28 only on the chip top surface 30, it is found that more consistent orientation results are obtained if a mass of solder is added only to the top metal electrode, thus further increasing the top to bottom asymmetry. The step of adding the extra mass of solder adds cost to the process and well as adding complexity and attendant inevitable loss of product.

(For completeness of description, it is noted that one practice is to add solid copper balls within the solder mass which retain their shape during the soldering process. The solid copper balls provide a minimum solder joint thickness which is greater than the thickness (height) of the passivating layer ring 28. The thick solder joint provides a stand-off of the upper terminal relative to the ring 28, hence a dimple in the terminal is not required).

In accordance with the present invention, no inversion of some chips relative to other chips is done, hence there is no need for the extra upper mass of solder. Also, the chips are not stacked one on top of the other, thus simplifying the chip placement process during manufacture.

Figure 3:
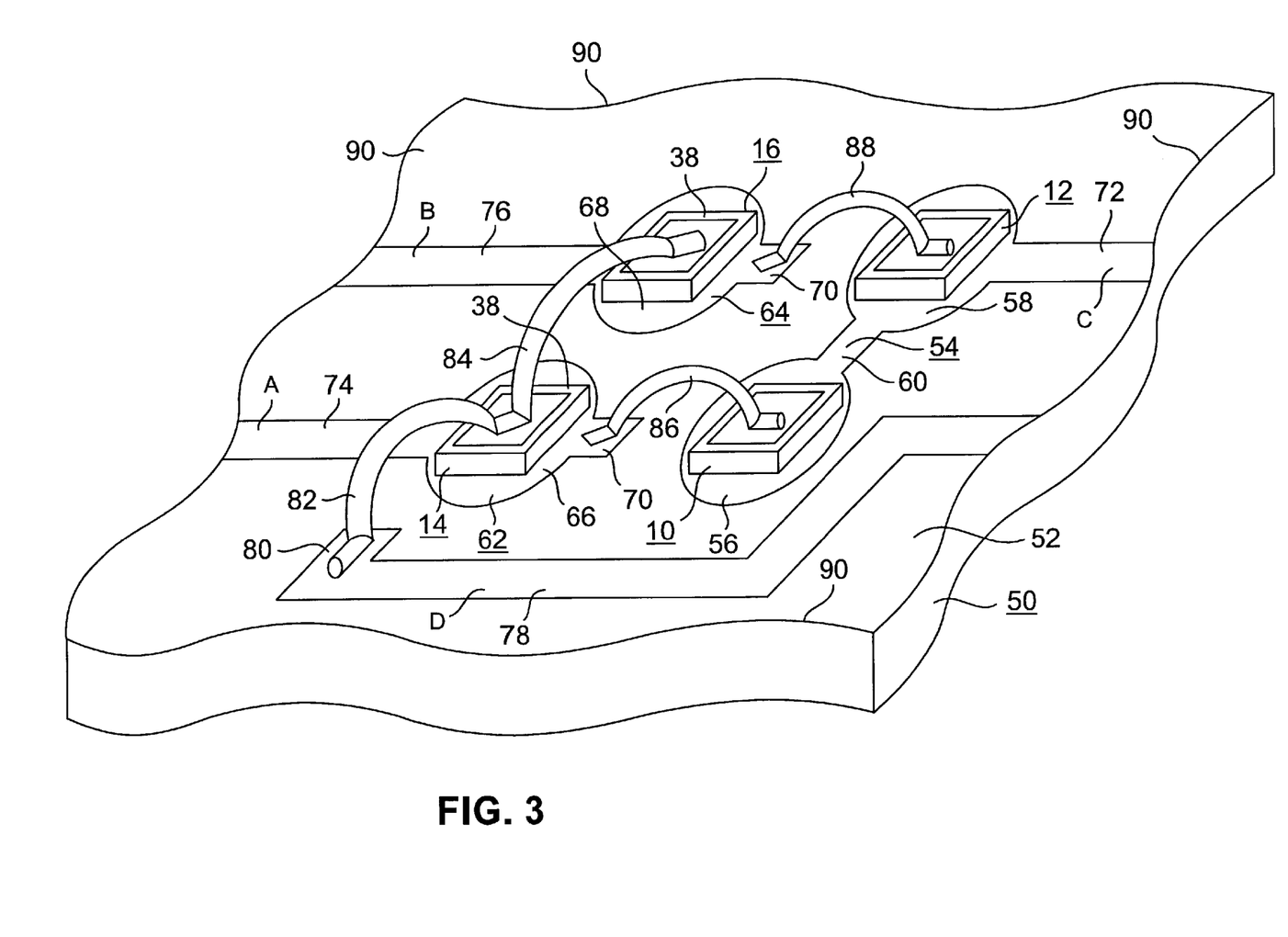
FIG. 3 is a perspective view of a portion of a printed circuit board showing, in accordance with one embodiment of the invention, four semiconductor chips interconnected by means of wire bonds in accordance with the circuit diagram shown in FIG. 1.

One embodiment of the invention is now described. FIG. 3 shows a known type of printed circuit board 50 comprising, for example, a "board" or substrate of insulating material, e.g., of an epoxy resin or a beryllia ceramic, and preferably of relatively high thermal conductivity. Disposed on a surface 52 of the substrate 50 is a layer of metal (typically copper) patterned into a number of spaced apart conductive areas, referred to herein as support plates, and interconnecting conductive paths. One support plate 54 comprises two circular areas, referred to as mounting pads 56 and 58, electrically connected together by a printed path 60. (To conserve space, square areas can be used with square chips. Circular areas, however, require less precision in the placement of the chips on the mounting pads.) Two other support plates 62 and 64 are also present on the substrate surface 52, the plates each comprising a generally circular mounting pad 66 and 68, respectively, and each plate including a respective mounting pad extension 70.

Four identical semiconductor chips 10, 12, 14 and 16, such as the chip 12 shown in FIG. 2, are fixedly mounted on the respective mounting pads 56, 58, 66 and 68 in identical top to bottom orientation, i.e., with the chip "bottom" (cathode) electrode 26 (FIG. 2) facing towards and being secured to the mounting pads. The mounting and bonding of semiconductor chips on mounting pads on printed circuit boards is known. Typically, as mentioned, the chips are soldered in place. Other known chip adhering means can be used.

Conductive paths 72, 74 and 76 are extensions of, and extend away from, respective support plates 54, 62, and 64. As shortly to be described, these conductive paths serve as three of the terminals of the bridge rectifier device. A device fourth terminal comprises a printed circuit path 78 terminating close to but not connected to the support plate 62. Rather, the end 80 of the path 78 is connected, e.g., by a wire 82, to the top surface 38 of the chip 14 mounted on the support plate 62. The bonding of fine wires for electrically interconnecting conductive surfaces is well known in the semiconductor art.

A wire bond 84 is also used for electrically connecting together the top surfaces 38 of the chips 14 and 16 mounted on the support plates 62 and 64, respectively, and wire bonds 86 and 88 are used for electrically interconnecting the two mounting pad extensions 70 of the two support plates 62 and 64 to the top surfaces of respective chips 10 and 12 mounted on the support plate 54.

Assuming that all four chips 10, 12, 14 and 16 are mounted cathode electrode down, it is readily seen that the four chips shown in FIG. 3 correspond to the four chips in the circuit diagram shown in FIG. 1. Thus, the two chips 10 and 12 in both figures are connected cathode to cathode (via the common support plate 54) while the two chips 14 and 16 are connected anode to anode (via the wire bond 84). Also, the anode of chip 10 is connected to the cathode of chip 14, and the anode of chip 12 is connected to the cathode of chip 16. The conductive path 72 (FIG. 3) connected to the cathodes of chips 10 and 12 corresponds to node C in FIG. 1. The conductive path 78 connected to the anodes of chips 14 and 16 in FIG. 3 (via the bonding wires 82 and 84) corresponds to the node D in FIG. 1. The conductive path 74 connected to the cathode of chip 14 and to the anode of the chip 10 (via the bonding wire 86) in FIG. 3 corresponds to the node A in FIG. 1. Lastly, the path 76 in FIG. 3 connected to the cathode of chip 16 and to the anode of chip 12 corresponds to the node B in FIG. 1. (In the circuit shown in FIG. 1, the terminal C is always positive relative to the terminal D for any polarity of the applied voltage. If the four chips are all mounted anode side down, the terminal C is always negative relative to the terminal D.)

Although FIG. 3 shows elements of but one bridge rectifier device assembled on a surface of a printed circuit board, in a preferred use of the invention, the pattern of conductive areas (and bonding wires) shown in FIG. 3 is identically repeated, in spaced apart relationship, over the surface of a printed circuit board. Each pattern, or device "cell", comprises the three support plates 54, 62 and 64 centrally mounted within the cell with the four conductive lines 72, 74, 76 and 78 extending to and terminating at edges (generally indicated by broken lines 90) of the cell.

Figure 4:
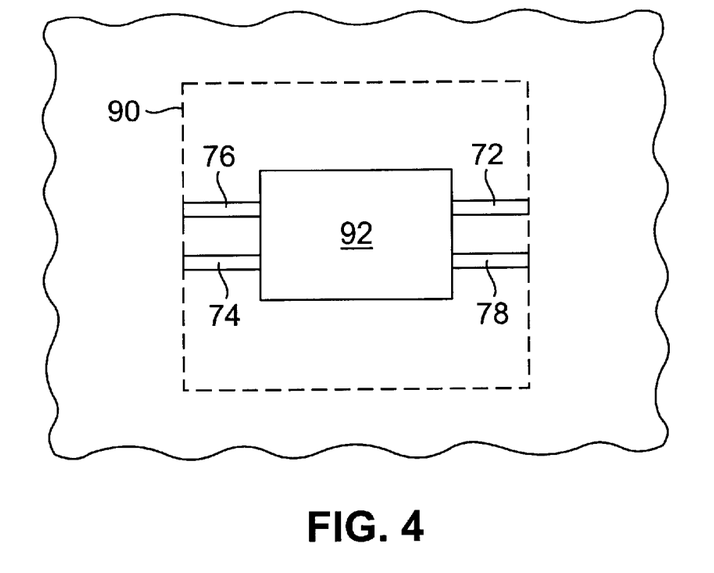
FIG. 4 is a plan view of the portion shown in FIG. 3 with a housing encapsulating the device components with the exception of outwardly extending device terminals.

Four chips, as shown in FIG. 3, are mounted and electrically interconnected within each cell and, for fabricating individual bridge rectifier devices, the central portions of each cell, including the four chips and interconnecting wire bonds, are plastic encapsulated, using known plastic molding techniques, for providing housings for each device. Each device (FIG. 4) thus comprises a portion of the starting printed circuit board enclosed within a plastic housing 92 enclosing four interconnected chips with four conductive terminal paths extending outwardly from the housing along the surface of the substrate. Finally, the circuit board is diced along the edge lines 90 for separating the individual bridge rectifier devices.

As previously described, two problems in the process disclosed in the aforecited patent are the needs for inverting one pair of chips relative to a second pair of chips and for forming two-chip chip stacks. In the process illustrated in FIG. 3, however, all four chips are placed in identical top to bottom orientation and laterally spaced apart, hence the noted two prior art problems are avoided.

In the embodiment shown in FIG. 3, wire bonds of known type are used. An advantage of such wire bonds is that extremely fine wires can be precisely bonded onto quite small bonding areas. Thus, in the situation illustrated in FIG. 2 where the upper electrode 24 is surrounded by an annular layer 28 of passivating material, wire bond connections can be consistently made to the metal electrode 24 with little risk of the bonding wire contacting the passivating layer 28.

Shortcomings of wire bonds, however, are that they are relatively expensive (in terms of materials, equipment and processing time) and, depending on the fineness of the wires, are typically used in relatively low power devices.

Figure 5:
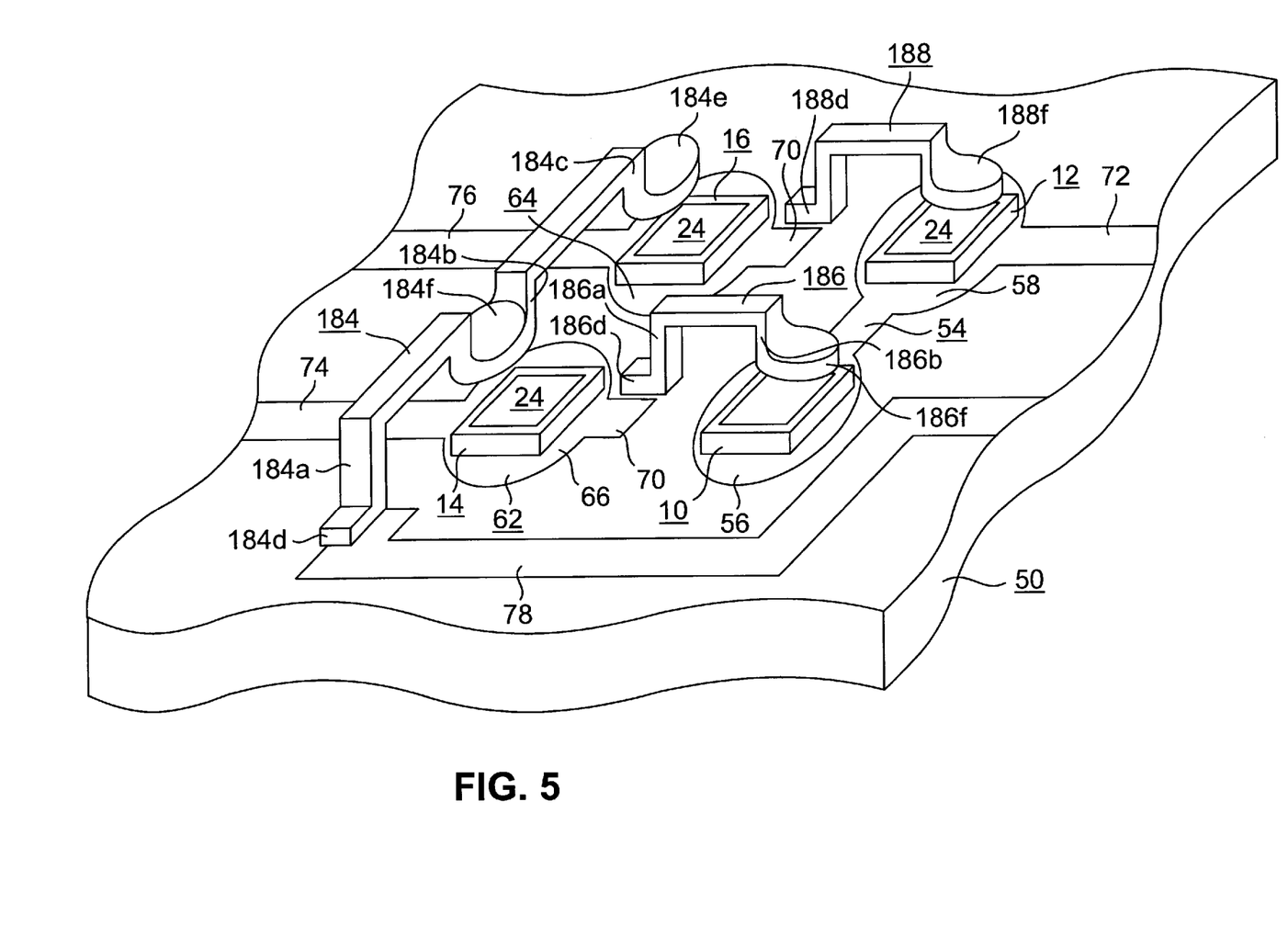
FIG. 5 is a view similar to FIG. 3 but showing, in exploded relationship with the printed board workpiece, stamped metal "jumper" electrical interconnectors.
Figure 6:
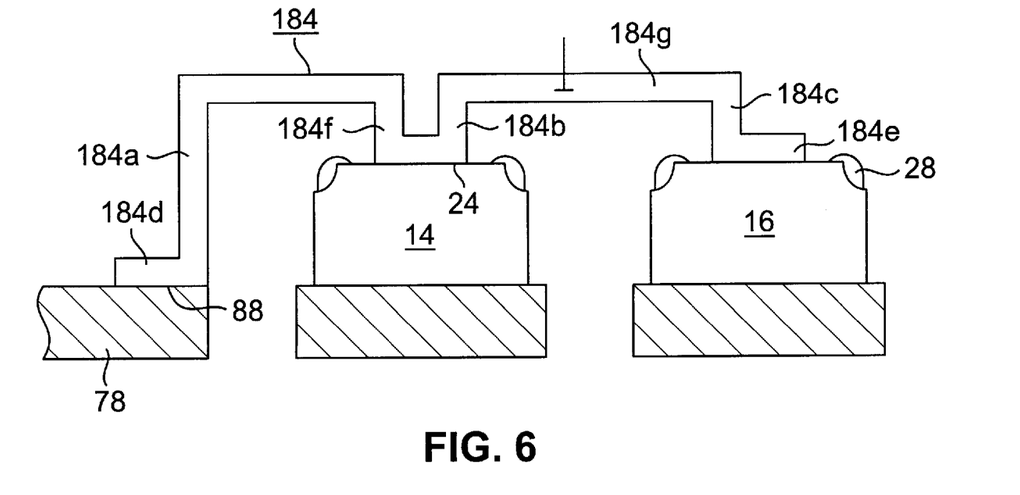
FIGS. 6 and 7 are side elevational views of two of the jumpers shown in FIG. 5 but shown bonded to the printed board workpiece.
Figure 7:
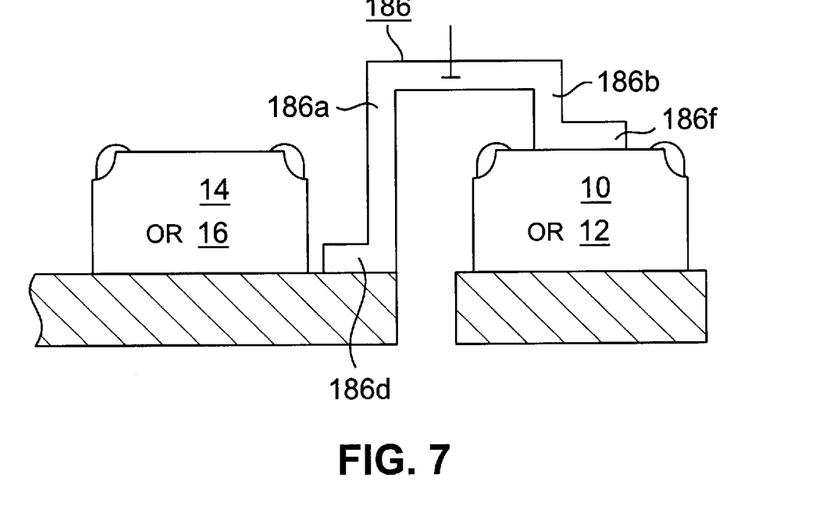

In another embodiment of the invention illustrated in FIG. 5, the identical printed wiring board 50 is used, but the wire bonds are replaced with rigid and pre-formed "jumpers." FIG. 5, as well as FIGS. 6 and 7, show two types of jumpers ("single" and "double"); both of which are of metal and are preferably made by known metal stamping and forming processes. Most conveniently, the jumpers are batch formed as parts of a separate lead frame for convenient storage and use.

A first jumper 184 (FIG. 6), of the "double" type, is roughly of W-shape with three dependent legs 184*a*, 184*b* and 184*c*, with the middle leg 184*b* and one end leg 184*c* being of the same length and smaller than the other end leg 184*a*. All three legs terminate in respective bonding pads 184*d* and 184*e* (at the ends of the end legs 184*a* and 184*c*) and 184*f* (at the end of the middle leg 184*b*). In FIG. 5, the jumper 184, when in contacting relation with the printed circuit board workpiece, replaces the wire bond 84 in FIG. 3 and functions to interconnect (in a first "jump") the anodes of the two chips 14 and 16 as well as to connect (in a second "jump") the anode of the chip 14 to the conductive path 78. While not illustrated herein, known automatic "pick-and-place" transfer mechanisms (equivalent to robot arms and hands) can be used for grasping a pre-oriented jumper 184 from a storage tray (or from a lead frame of jumpers and breaking the jumper free from delicate links holding the jumper on the lead frame) and transferring and depositing the jumper precisely in place on the workpiece. As so deposited, the legs 184b and 184c of the jumper are centered within the passivating layer rings 28 of the respective chips 14 and 16 with the respective jumper bonding pads 184f and 184e resting on the chip upper metal electrodes 24, and the jumper bonding pad 184d resting on the end 80 of the conductive path 78.

The jumper 184 is preferably soldered to the two chip electrodes 24 and to the conductive path 78 and, to this end, a small dot of solder paste is placed on the metal electrodes and path prior to placement of the jumper. Alternatively, the solder paste is replaced with a dot of electrically conductive adhesive which serves the securing function.

A "single" type jumper is also shown in FIGS. 5 and 7. Two such jumpers 186 and 188 are used for connecting the mounting pad extensions 70 of the two support plates 62 and 64 to the anode electrodes 24 of the two chips 10 and 12, respectively. Similarly as with the two legs 184a and 184b of the double jumper 184, the two legs of the jumpers 186 and 188 terminate in respective pairs of mounting pads (186d and 186f, and 188d and 188f) to be solder bonded respectively to a conductive area 70 (an exposed mounting pad extension) on a surface of the printed wiring board 50 and an anode electrode 24 on a respective chip 10 and 12. The two single jumpers 186 and 188 can be picked-up, transferred, deposited and tacked in place identically as the double jumper 184.

As indicated, pre-formed metal jumpers provide certain advantages over wire bonds. The jumpers, of metal strips, generally have higher power handling capacity and can be generally less expensive to use than wire bonds, particularly if assembled in batch assembly processes.

The jumpers are also preferable to the previously described (FIG. 2) terminals 34 which include dimples 40 for extending centrally of the passivating layer ring 28 and into contact with the metal electrode 24. Providing the dimples is relatively expensive and, worse, the lengths of the dimples made in typical, e.g., punching, dimpling procedures, are relatively small. Thus, even when the dimples 40 are properly centered within the passivating material rings 28, owing to the relatively short heights of the dimples, the gap between an under surface 34a of the dimpled terminal lead 34 and the passivating ring 28 is so small as to be bridgeable by solder flowing up the dimple and spreading along the under surface 34a of the terminal lead 34.

Such solder bridging problem is easily avoided using the various jumpers 184, 186 and 188 simply by making the legs of the various jumpers sufficiently long such that the leg interconnecting portions of the jumpers (e.g., FIG. 6, the portion 184g of the jumper 184) are spaced well above the passivating rings 28. Providing pre-formed metal jumpers with long legs is considerably easier than providing correspondingly long dimples using known dimple forming processes.

Although not illustrated herein, "laminate" types of printed wiring boards are known using "buried" conductive layers for providing electrical interconnections and terminals for various components mounted on the printed wiring boards. The present invention can be implemented using such laminate types of printed wiring boards in which case the buried interconnections can be used in place of the various wire bonds shown in FIG. 3 and the jumpers shown in FIG. 5.

Figure 8:
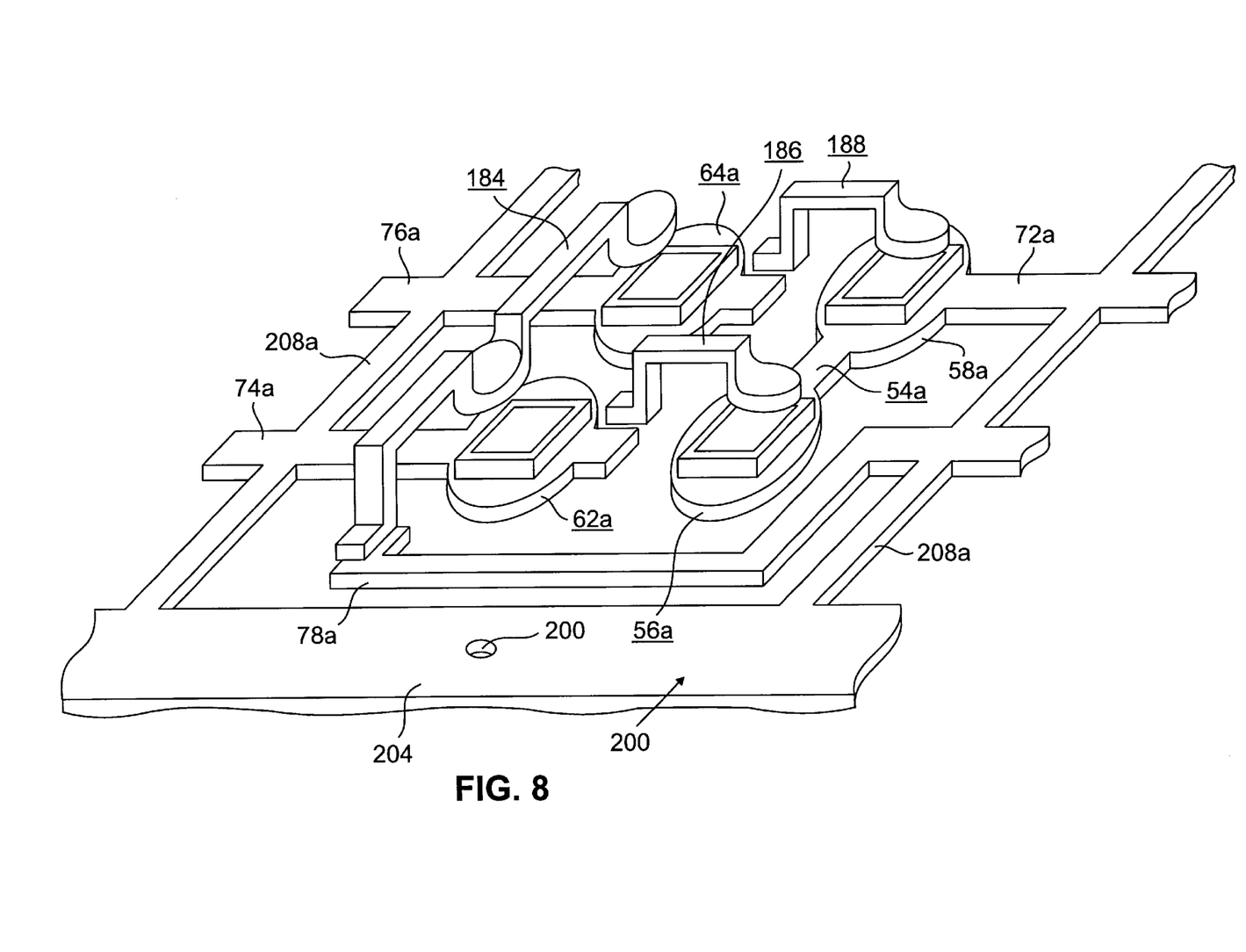
FIG. 8 is a perspective view of a portion of a lead frame showing, in accordance with a second embodiment of the invention, four chips interconnected by means of metal jumpers shown in exploded relationship with the workpiece.
Figure 9:
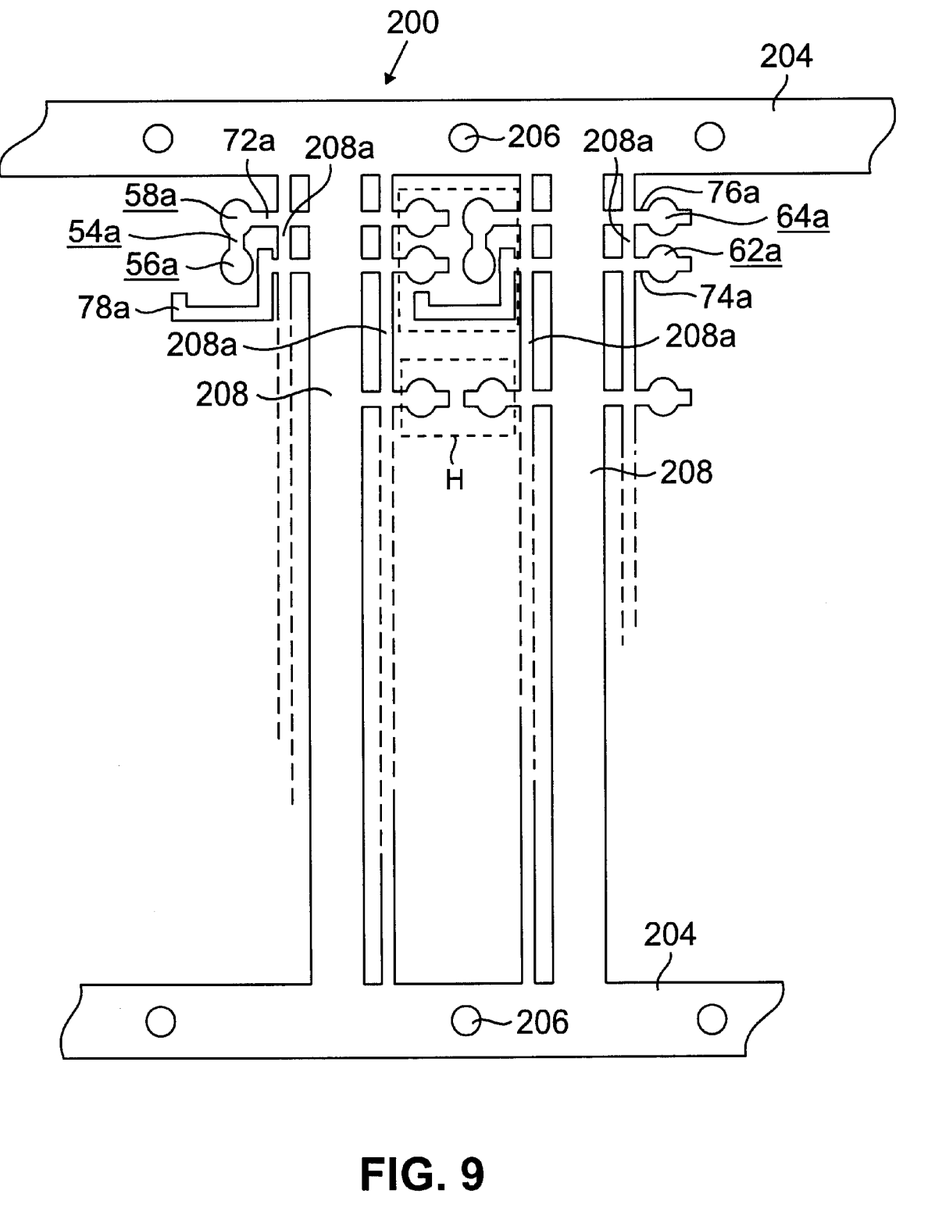
FIG. 9 is a plan view of a portion of a lead frame workpiece including multiple groups of leads such as the single group shown in FIG. 8.

Another (and the presently preferred) embodiment of the invention is illustrated in FIGS. 8 and 9 which show a single lead frame 200 somewhat similar to any one of the three lead frames used in the batch manufacturing process disclosed in the aforecited U.S. Pat. No. 5,484,097. As noted in the patent, lead frames are known in the semiconductor industry and, while taking many forms, generally comprise a flat sheet of metal stamped (or etched) into a filigree of interconnected leads. In the embodiment shown in FIGS. 8 and 9 herein, the single lead frame 200 comprises an elongated metal sheet defined by a pair of elongated parallel rails 204 having openings 206 therethrough by means of which the lead frame can be precisely positioned and advanced. Extending between the side rails 204 are cross bars 208 from which various cantilevered leads extend. FIG. 8 shows a group of cantilevered leads used for fabricating a single rectifier. As indicated in FIG. 9, the group of leads shown in FIG. 8 is but one of numerous, identical lead groups provided on the lead frame 200. In one embodiment of the present invention, the lead group shown in FIG. 8 is repeated in an array of eight rows and eighteen columns for a total of one hundred and forty-four rectifiers to be batch fabricated on each lead frame. In general, but with the exceptions herein noted (principally, the use of but one lead frame and four spaced apart and identically oriented chips), the processes and apparatus disclosed in Pat. No. 5,484,097 can be used in the use of the present invention.

The lead frame arrangement shown in FIGS. 8 and 9 corresponds almost exactly to the pattern of conductive areas shown in FIGS. 3 and 5 as well as using the identical jumpers shown in FIG. 5. Because of this, reference numbers used in FIGS. 3 and 5 identifying elements similar to but not identical to those in FIGS. 8 and 9 are repeated in FIGS. 8 and 9 but followed by the letter "a". Thus, while FIG. 5 shows four conductive paths 72, 74, 76 and 78 serving as terminals for the completed rectifiers, FIGS. 8 and 9 show four cantilevered leads 72a, 74a, 76a and 78a likewise serving as terminals in the completed rectifiers. In FIG. 5, all the conductive areas are disposed on the surface of a rigid substrate 50. In FIGS. 8 and 9, the various cantilevered leads 72a, 74a, 76a, and 78a are part of a self-supporting lead frame (e.g., of 10 mil thick copper measuring 8 by 14 inches) and are secured to later-to-be-discarded portions of the lead frame.

As previously noted, the various cantilevered leads extend (FIG. 9) from cross bars 208 extending between parallel side rails 204 of the lead frame. Each pair of leads (e.g., leads 72a–78a and 74a–76a) extending from one cross bar 208 is interconnected by a further continuous bar 208a serving (during device encapsulation, as hereinafter described) as a dam bar. The two dam bars 208a are also useful as providing greater mechanical strength to the lead frame.

As in the FIG. 5 arrangement, the cantilevered lead 72a (FIG. 8) is integral with a "support plate" 54a connecting together two enlarged mounting pads 56a and 58a. In the herein illustrated embodiments, the identical semiconductor chips used in the FIG. 5 arrangement are used in the FIGS. 8 and 9 arrangement, and the descriptions of the various mounting pads, the chips mounted thereon, and the jumpers used to electrically interconnect the rectifier components provided for FIG. 5 apply substantially identically to the FIGS. 8 and 9 embodiments.

Certain manufacturing differences are present owing to the nature of the two workpieces, but such differences, and appropriate manufacturing procedures are known to workers in the relevant manufacturing arts. During chip mounting, for example, the rigid substrate 50 in the FIG. 5 arrangement provides mechanical support. With the FIGS. 8 and 9 arrangement, the lead frame is disposed within an appropriate fixture providing both precise orientation and positioning of the lead frame and mechanical support for all the lead frame parts against which chip (and jumper) mounting pressures are to be applied.

FIG. 8 shows the various jumpers 184, 186 and 188 in exploded relation to the components contacted by the jumpers. When all the parts are in assembled together relationship with the jumpers soldered in place, each workpiece group of components appears somewhat as shown in FIG. 3 (with jumper interconnectors rather than the wire bonds shown).

While the various jumpers shown in FIG. 8 (and 5) are the preferred interconnectors, the jumpers can be replaced with wire bonds such as shown in FIG. 3.

Then, and as described in the aforecited U.S. patent, each group of components (e.g., the 144 groups on the illustrative lead frame workpiece) is encapsulated within (FIG. 10) a molded plastic housing while the component groups are still affixed to the lead frame. In FIG. 9, a dashed line box H is used to show which portion of each group of components on the lead frame is encapsulated (such components, within each group, including the four chips and three jumpers shown in FIG. 8 or, if used, wire bonds such as shown in FIG. 3). Comparing FIG. 10 with FIGS. 8 and 9 it is seen that only parallel portions of the four leads 72a, 74a, 76a and 78a extend from the housing 92a with the dam bars 208a being disposed outside of an immediately adjacent to the housing exterior surface.

The use of dam bars for plastic encapsulating various components mounted on lead frames is known; the function of the dam bars being to limit escape of plastic molding material injected, under pressure, from a cavity in which are disposed the components to be encapsulated. The lead portions not to be encapsulated extend through openings through the walls of the cavity defining mold and, as known, the dam bars 208a limit escape of the molding material through the cavity wall openings for preventing spread of the escaping material onto the outwardly extending rectifier terminals.

Figure 10:
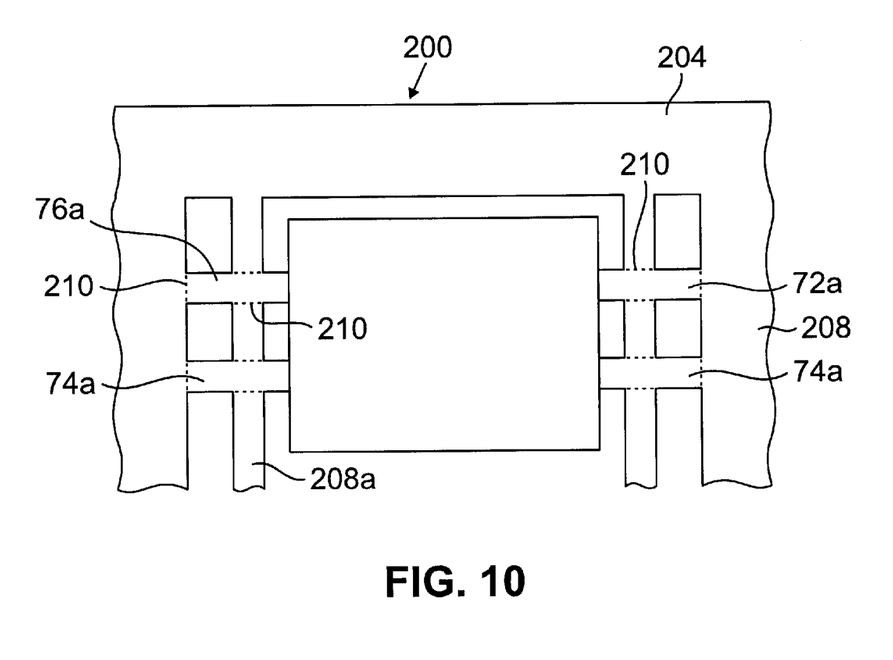
FIG. 10 is a view similar to FIG. 9 showing a housing encapsulating components of a single bridge rectifier at one site on the lead frame workpiece.

After encapsulation, each device is separated from the lead frame by cutting through the lead frame along the dotted lines 210 shown in FIG. 10.

As previously noted, the lead frame group of components shown in FIG. 8 is essentially a self-supporting version of the conductive areas supported on the insulating board of the printed circuit board 50 shown in FIGS. 3 and 5. It is noted, however, that to persons of skill in the relevant arts, printed circuit board technology is quite separate and distinct from lead wire technology. The description of the similarity between the embodiments shown in FIGS. 3 and 5 and in FIG. 8 is part of the inventive disclosure herein and, indeed, the embodiments shown in FIGS. 3 and 5 arose as a "generalization" of the prior developments of the lead frame embodiments.

As earlier described, the various jumpers used for interconnecting purposes (e.g., the jumpers 184 and 186 shown in FIGS. 6 and 7) are typically individual, separate parts added to the workpiece after the chips are soldered in place. The jumpers, for example, can be disposed in trays for being automatically picked up by robot type arms for being mounted in place.

For greater efficiency, it is also possible to provide the jumpers as part of a lead frame for use in conjunction with, for example, the lead frame 200 shown in FIG. 9. In one arrangement, for example, after all the chips have been soldered in place on the lead frame 200 shown in FIG. 9, a separate "jumper" lead frame (not illustrated) including a plurality of jumper sites corresponding to the device sites on the workpiece is disposed over the lead frame 200. Each jumper site includes three preferably cantilevered leads extending from a common portion of the jumper lead frame with each lead being shaped as a respective jumper 184, 186 and 188 shown in FIG. 8. With the jumper lead frame so disposed for aligning the various jumpers at each jumper site with corresponding components to be interconnected at each device site on the lead frame 200, a top jig with downwardly dependent fingers is disposed overlying the jumper lead frame for pressing the bonding pads of the respective jumpers against corresponding component bonding surfaces. After heating, for solder bonding (or ultrasonic welding, or the like) the jumpers to the components, the jumper lead frame is cut or broken away from the rigidly secured jumpers for leaving separate interconnecting jumpers in place on the workpiece.

Figure 11:
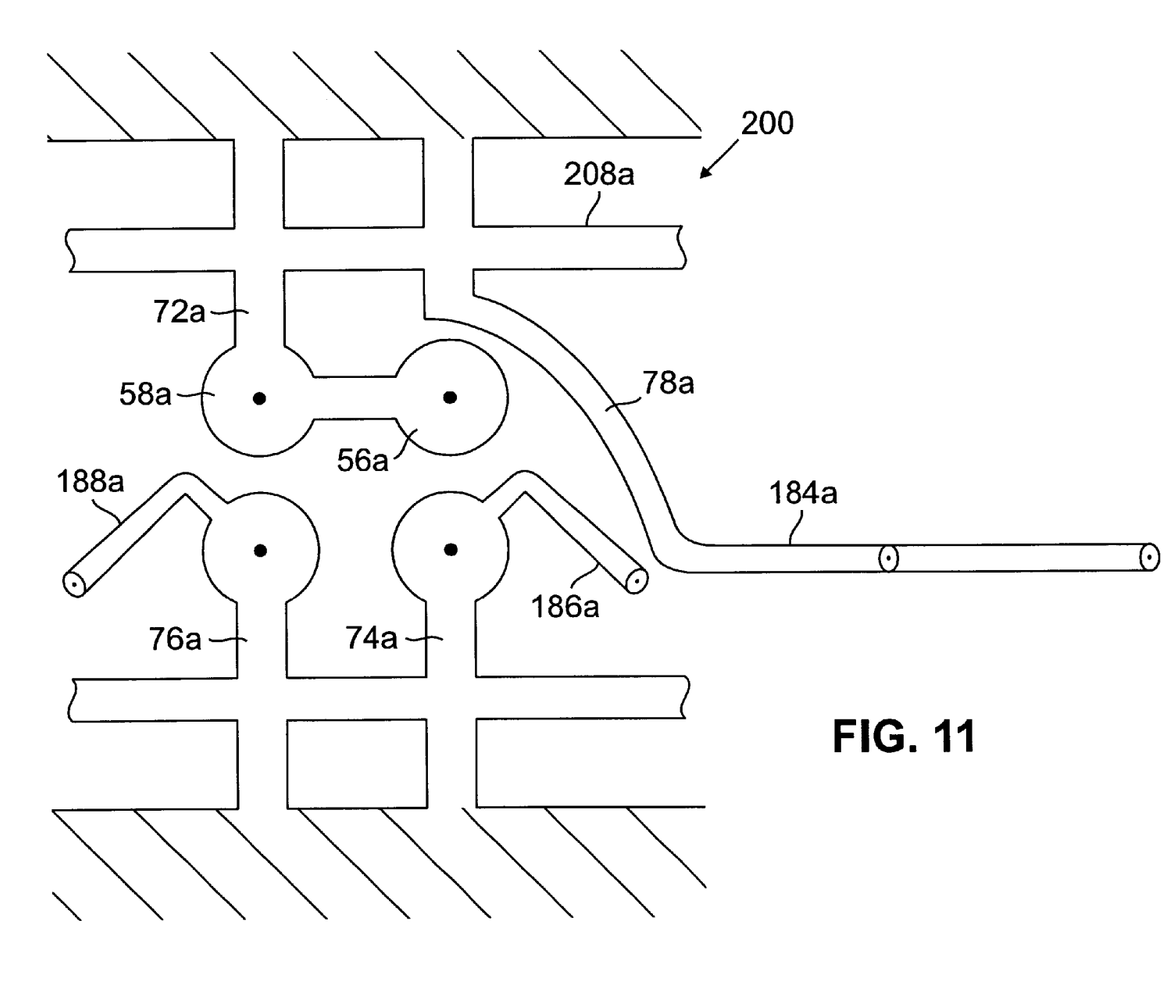
FIGS. 11 and 12 are plan views showing one workpiece component site using jumpers integral with the workpiece lead frame.
Figure 12:
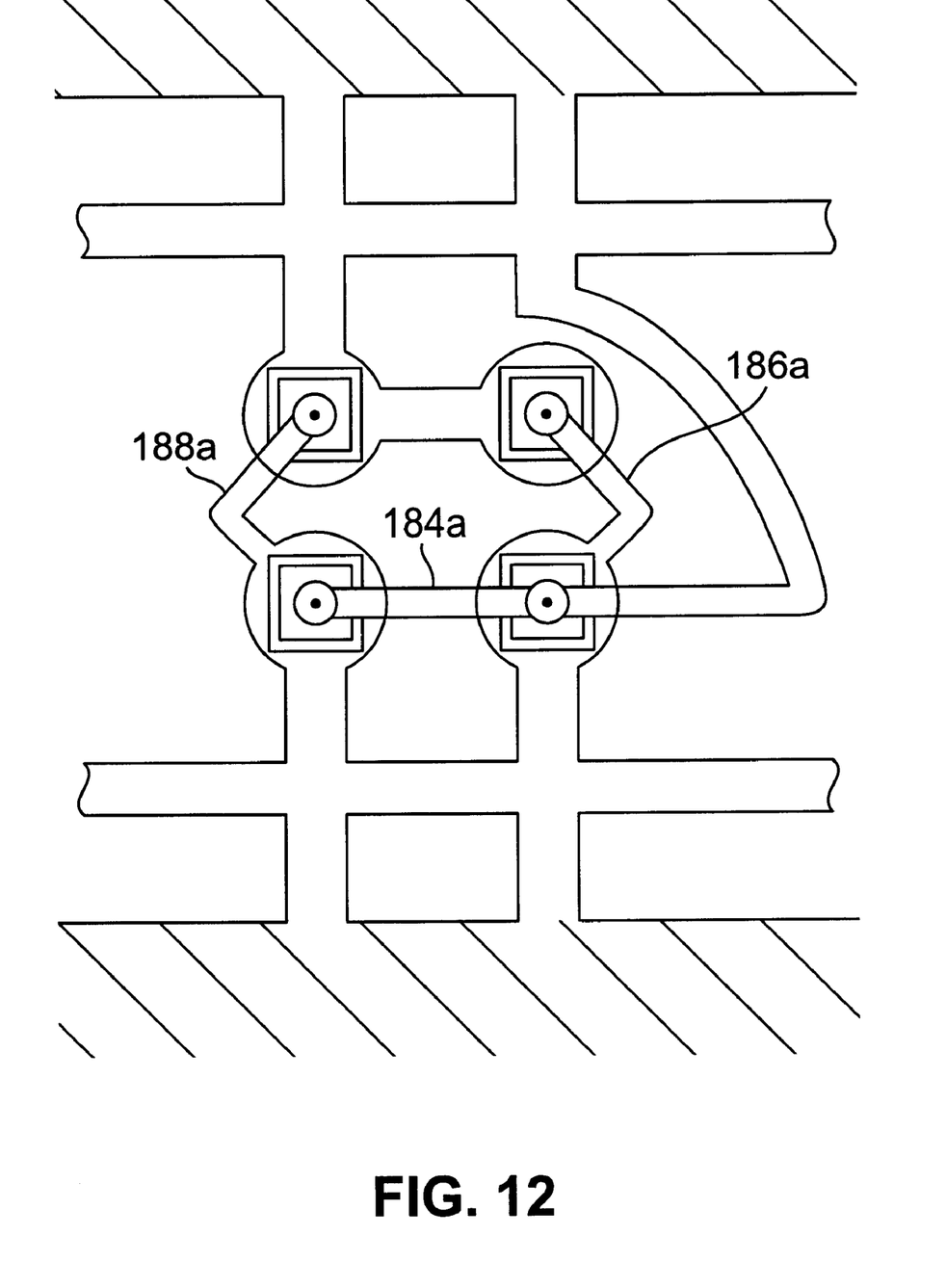

In still another embodiment, shown in FIGS. 11 and 12, all the needed jumpers are included at each device site as extra cantilevered "jumper" leads 184a, 186a, and 188a all initially lying in the plane of a lead frame 200a formed by typical stamping or etching processes, or the like.

Then, after all the chips have been mounted in place on the respective bonding pads 56a, 58a, 62a, and 64a, the extra jumper leads 184a, 186a, and 188a are folded over as shown in FIG. 12 for providing interconnections among the device components. (While added shaping of the extra jumper leads 184a, 186a, and 188a is necessary for providing "dimple-like" dependent bonding pads, such as shown at 184f and 184e in FIG. 6, for proper contacting with the upper surfaces (FIG. 2) of the chips, such shaping is not necessary if, for example, the chips are mounted anode side down.) After folding and bonding the jumper leads 184a, 186a, and 188a in place, completion of the devices can be as previously described.

What is claimed is:

1. A method of fabricating a semiconductor device comprising four substantially identical semiconductor diode chips, each of said chips having top and bottom surfaces, the method comprising the steps of a) mounting said four chips, bottom surfaces down, in electrical contact with respective chip mounting pads, a first and a second of said pads being integrally connected to one another for electrically interconnecting the bottom surfaces of a first and a second chip mounted respectively on said first and second pads, b) electrically interconnecting the top surface of a third chip mounted on a third pad to the top surface of a fourth chip mounted on a fourth pad, c) electrically interconnecting said third and fourth pads to the top surfaces of said first and second chips, respectively, d) electrically connecting a first device terminal to said first and second interconnected pads, e) electrically interconnecting second and third device terminals to said third and fourth pads, respectively, and f) electrically interconnecting a fourth device terminal to one of the electrically interconnected top surfaces of said third and fourth chips, wherein said first, second and third terminal conductive areas are integrally connected to said integrally connected first and second pads, and to said third and fourth pads, respectively, and wherein said electrical interconnections other than said integral connections are provided by disposing preshaped metal jumpers in bridging, bonded relationships with the surfaces being electrically interconnected.

2. A method of fabricating a semiconductor device comprising four substantially identical semiconductor diode chips, each of said chips having top and bottom surfaces, the method comprising the steps of a) mounting said four chips, bottom surfaces down, in electrical contact with respective chip mounting pads, a first and a second of said pads being integrally connected to one another for electrically interconnecting the bottom surfaces of a first and a second chip mounted respectively on said first and second pads, b) electrically interconnecting the top surface of a third chip mounted on a third pad to the top surface of a fourth chip mounted on a fourth pad, c) electrically interconnecting said third and fourth pads to the top surfaces of said first and second chips, respectively, d) electrically connecting a first device terminal to said first and second interconnected pads, e) electrically interconnecting second and third device terminals to said third and fourth pads, respectively, and f) electrically interconnecting a fourth device terminal to one of the electrically interconnected top surfaces of said third and fourth chips, and g) providing said integrally connected first and second pads, said third and fourth pads, said first, second and third terminals, and a portion of said fourth terminal as integral portions of cantilevered leads forming one of a plurality of identical groups of leads on a single lead frame, wherein said first, second and third terminal are portions of respective first, second and third leads including said integrally connected first and second pads and third and fourth pads, respectively, wherein said electrical interconnections other than said integral connections are provided by disposing pre-shaped metal jumpers in bridging, bonded relationships with the surfaces being electrically interconnected.

* * * * *